United States Patent [19]

Finger

[11] 4,017,724

[45] Apr. 12, 1977

[54] APPARATUS FOR MEASURING BATTERY DEPLETION BY MONITORING REDUCTIONS IN VOLTAGE

[75] Inventor: Eugene P. Finger, Brewster, N.Y.

[73] Assignee: Curtis Instruments, Inc., Mount Kisco, N.Y.

[22] Filed: June 27, 1975

[21] Appl. No.: 591,055

[52] U.S. Cl. .......................... 235/151.31; 340/249; 340/48

[51] Int. Cl.² ......................................... G01R 13/02

[58] Field of Search ............... 235/151.31, 151.21, 235/92 EL, 92 MT; 324/29.5, 99 D, 189; 340/249; 320/48

[56] References Cited

UNITED STATES PATENTS

| | | | |
|---|---|---|---|
| 3,383,580 | 5/1968 | Wallace, Jr. ......................... | 320/48 |
| 3,522,481 | 8/1970 | Terzic ............................ | 340/249 X |
| 3,529,230 | 9/1970 | Tedd ............................. | 340/249 X |
| 3,532,968 | 10/1970 | Overlie .......................... | 340/249 X |
| 3,568,175 | 3/1971 | Schwehr et al. .................. | 340/249 |
| 3,852,732 | 12/1974 | Yorksie et al. ..................... | 340/249 |
| 3,894,278 | 7/1975 | Gerum .......................... | 340/249 X |
| 3,899,732 | 8/1975 | Staby ........................... | 340/249 X |

Primary Examiner—Edward J. Wise
Attorney, Agent, or Firm—Pennie & Edmonds

[57] ABSTRACT

The apparatus comprises means for sensing reductions in the output terminal voltage of the battery due to varying load conditions and producing a signal in response thereto during the time that the terminal voltage is below a threshold value. The apparatus further comprises integrator means such as an electronic counter or a stepping motor for integrating said signal and means for displaying the integral accumulated by said integrating means.

9 Claims, 7 Drawing Figures

APPARATUS FOR MEASURING BATTERY DEPLETION BY MONITORING REDUCTIONS IN VOLTAGE

BACKGROUND OF THE INVENTION

The present invention is directed to a system for maintaining control over the state of charge of a battery. It is especially useful for monitoring rechargeable storage batteries such as those used in battery powered vehicles. These vehicles may include various battery powered tools, such as fork lifts or the like, and the invention will be described in detail in the context of such a vehicle. However, the inventive system may also be used in any battery powered system which employs rechargeable or nonrechargeable batteries. The state of charge of the battery is detected by monitoring transient reductions in terminal voltage during operation of the vehicle and using this information and the relationship between battery capacity and the magnitude and duration of fluctuations in battery terminal voltage to derive state of charge information. A number of systems monitoring battery depletion in this manner are disclosed in U.S. application Ser. No. 538,463, now abandoned, entitled "System for Measuring Battery Depletion by Monitoring Voltage", the disclosure of which is hereby incorporated by reference.

The depletion of battery charge is monitored by generating and integrating a signal related to the magnitude and duration of fluctuations in the battery terminal voltage. The state of charge of the battery may be displayed by any device such as an electric meter that is calibrated in terms of percentage charge remaining in the battery. The display is similar to a display showing the fuel remaining in a conventional gasoline powered vehicle and is therefore quite easy for an operator familiar only with gasoline powered vehicles to read and understand. The system is also provided with means for detecting when the remaining charge in the battery has been depleted below a predetermined level and disabling the various tools on the vehicle, leaving only those systems that are essential for the return of the vehicle to a battery charging station.

SUMMARY OF THE INVENTION

In the preferred embodiments, connection of the battery to the vehicle results in the actuation of a circuit which determines whether the battery is freshly charged by detecting whether the voltage present at the terminals of the battery is above a predetermined threshold value. Insofar as a newly charged battery has an output voltage which is significantly higher than the nominal terminal voltage, this threshold value may, dependent upon battery type, typically be in the order of about 10 percent above the nominal terminal voltage. If this threshold voltage is detected by the circuit, it furnishes a fairly reliable indication that the battery is freshly charged and causes the state of charge monitoring circuitry to produce an indication that the battery is fully charged.

As the battery is used, varying load conditions placed across the battery cause the voltage to be reduced. The magnitude and duration of these voltage reductions is monitored by a threshold circuit which produces an output when the terminal voltage falls below a threshold. The output of the threshold circuit is connected to circuitry which generates a train of pulses in response to reductions in voltage. The number of pulses generated is proportional to the time during which the terminal voltage is below the threshold voltage. In the preferred embodiments, the pulse generating circuitry takes the form of either a voltage controlled oscillator or a relaxation oscillator.

The pulse generating circuitry is in turn connected to means for counting the pulses, thus generating an integral which is proportional to the time that the terminal voltage has been below the threshold voltage. In the preferred embodiments, the counting means, i.e., the integrator takes the form of an electronic counter or a stepping motor. The output of the integrator furnishes an indication of the state of charge. The output of the integrator also activates an alarm which warns the operator of the state of charge of his vehicle battery at a predetermined low state of charge and, at a lower level of charge, disables auxiliary functions on the vehicle such as the fork lift, thereby forcing the operator to return to the base station for a fresh battery.

DETAILED DESCRIPTION OF THE PREFERRED EMBODIMENTS

Figure 1:
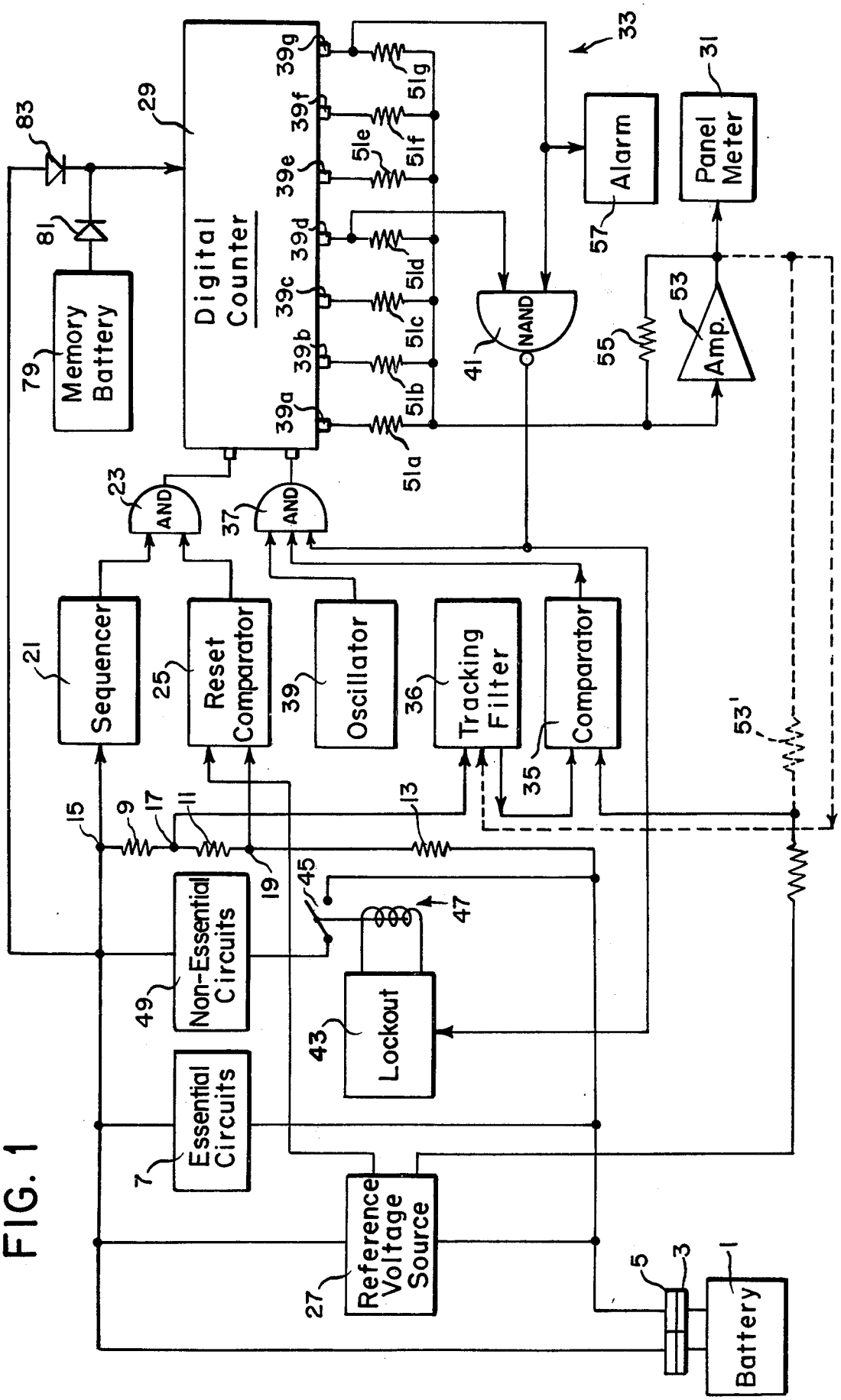
FIG. 1 is a schematic diagram of the power system of a battery powered vehicle incorporating a control system for monitoring the state of charge of the battery.

Referring to FIG. 1, power is supplied to the system by a battery 1. Battery 1 is coupled to the system via mating connectors 3 and 5. Connection of the battery to the system via connectors 3 and 5 results in coupling power to essential circuits 7. These circuits include all the systems in the vehicle which one does not wish to disable in response to the indication of a depleted state of charge in the battery. Connection of the battery to the system also results in application of a voltage to resistors 9, 11 and 13, thereby causing voltages to appear at points 15, 17 and 19 in the electrical circuit. The magnitudes of these voltages are functions of the magnitude of the voltage present at the output terminals of battery 1.

Connection of battery 1 to the system thus results in the application of voltage from point 15 to a sequencer 21. This causes the sequencer to produce a logical 0 output which is coupled to an AND gate 23 which is thus disabled and produces a logical 0 output. AND gate 23 is disabled in order to cause it to be unresponsive to any transients which may pass through the system during connection of the battery to the system via connectors 3 and 5. After a fixed period of time which may typically be in the order of one second, or as long as is necessary for all transients to subside, the output of the sequencer becomes logical 1. As also discussed above, connection of the battery to the system also results in the presence at point 19 of a voltage whose magnitude is proportional to the voltage present at the output terminals of battery 1. This voltage is coupled to a reset comparator 25 which compares it with a reference voltage supplied by a reference voltage source 27 which is powered by battery 1. If comparator 25 detects that the voltage present at the output terminals of battery 1 is above a threshold which may typically be in the order of 10 percent higher than the nominal terminal voltage of the battery for batteries of the lead-acid variety, comparator 25 will produce a logical 1 output which together with the logical 1 output of the sequencer will actuate AND gate 23 causing a logical 1 pulse to appear at its output. This logical 1 pulse is then coupled to a counter 29 thereby clearing any signal that may be in the counter and further resulting in the coupling of a signal indicative of full charge to panel meter display 31 via a digital to analogue converting circuit 33 which operates in a manner that will be set forth below.

The circuit of the present invention thus depends for its determination of the state of charge of the battery upon the fact that the voltage present at the output of the battery terminals will have an exceptionally high value if the battery has been fully charged. It has been empirically shown that this technique is generally quite reliable. Of course, the particular value of voltage which one wishes to test for varies as a function of the nominal terminal voltage of the battery and the battery type.

State of charge of the battery is ascertained by monitoring the amount of time that the terminal voltage has remained below a given threshold value. The terminal voltage is monitored by a tracking comparator 35 which detects when it is below a preselected threshold by comparing the voltage present at point 17 to a voltage which is a function of one of the outputs of a reference voltage source 27 and the voltage sent from digital-to-analogue convertor 33 to panel meter 31. The voltage at point 17 is coupled to comparator 35 by tracking filter 36. This prevents transients and other signals unrelated to battery depletion from being registered in the monitoring circuitry. Setting the response of filter 36 in the range of 10 to 100 milliseconds has been found to give excellent results, as this effectively eliminates microsecond and millisecond transients which are not related to charge depletion. The output of tracking comparator 35 is coupled to and AND gate 37. A free-running oscillator 39 is also coupled to AND gate 37. AND gate 37 is also responsive to the output of counter 29. Specifically, counter 29 includes a plurality of outputs 39a–g. When binary counter 29 has been cleared by the pulse sent from AND gate 23 all of its outputs are logical 0. Outputs 39d and 39g thus have logical 0 outputs which are coupled to a NAND gate 41 which thus produces a logical 1 at its output.

Thus, after the counter has been cleared, the detection of a drop in voltage below threshold results in the application of a logical 1 input to AND gate 37 by both tracking comparator 35 and NAND gate 41. This in turn causes gate 37 to apply the output of oscillator 39 to counter 29 thereby advancing the count of the counter whenever terminal voltage drops below the threshold value.

The logical 1 output of NAND gate 41 also serves to actuate lockout circuit 43, thereby closing the contacts 45 of a relay 47 and coupling power to any nonessential electrical circuits 49, such a power lift.

The output of counter 29 is converted to an analogue signal by summing resistors 51a–g. Resistors 51a–g have successively lower values, each resistor having one half of the resistance of the previous resistor. Thus, resistor 51a would have a value of R ohms, resistor 51b would have a value of R/2 ohms, resistor 51c would have a value of R/4 ohms and so forth. The current output from resistor 51b would thus be twice the current output from the resistor 51a, the current output from resistor 51c would be twice the output from resistor 51b, the current output from resistor 51d would have twice the current output from 51c, etc. Summing the total output of this resistor circuit thus causes it to act as a digital-to-analogue converter. The outputs from the resistors are therefore coupled together and sent to an analogue amplifier 53 which includes a resistive feedback path comprising resistor 55. Resistive feedback lends to the operation of the amplifier a measure of stability.

The output of the amplifier thus has an amplitude which is indicative of the number of pulses which have been coupled by AND gate 37 from oscillator 39. Insofar as these pulses are only coupled from the oscillator during the time that the tracking comparator senses voltage below threshold, and also due to the fact that the pulses occur periodically, the number of pulses is proportional to the amount of time that tracking comparator 35 has detected a voltage below threshold. Insofar as the time that the voltage is below threshold indicates the state of charge of the battery, the indication displayed on panel meter 31 reveals the state of charge of the battery. It may also be desirable to vary the level at which tracking comparator 35 is actuated. This may be done by connecting a resistor 53' from the output of amplifier 53 to the input of tracking comparator 35, as is illustrated in phantom lines. This feedback will have the effect of varying the threshold in response to the integral stored in counter 29. Insofar as the depletion of the battery results in greater voltage reductions, the connection of resistor 53' will have the desirable effect of lowering the threshold in response to a lower level of charge in the battery, thereby varying the linearity of the system.

The depletion of the battery also results in longer and deeper transients in the voltage present at point 17. It may therefore be desired to refine the system by varying the response of filter 36 to respond to these signals to a lesser extent as the integral present at the output of amplifier 53 increases. This may be done using the feedback path extending between amplifier 53 and filter 36 shown in dotted lines in FIG. 1.

When the counter has been advanced to one-half of its capacity, output 39g becomes a logical 1 which activates an alarm 57 thereby notifying the operator.

When the counter has been advanced somewhat beyond one half of its capacity, outputs 39d and 39g will both be logical 1. This will inhibit gate 37 via gate 41 and cause lockout circuit 43 to open contacts 45 of relay 47, thereby disconnecting power from non-essential circuits 49. The operator of the vehicle is thus forced to return to the charging station insofar as such nonessential work performing circuits as the power lift in the vehicle are disabled while such essential circuits as the traction motor are still operable.

Under various circumstances, the battery 1 may be disconnected from the system and then reconnected. It therefore becomes necessary to provide the system with a memory battery 79 which supplies power to counter 29 during the interval that the battery 1 is disconnected. If this is not done, counter 29 will lose the stored value when power is removed. Memory battery 79 is coupled to counter 29 by diode 81 which is biased into the nonconducting region by diode 83 when battery 1 is connected in the circuit.

Figure 2:
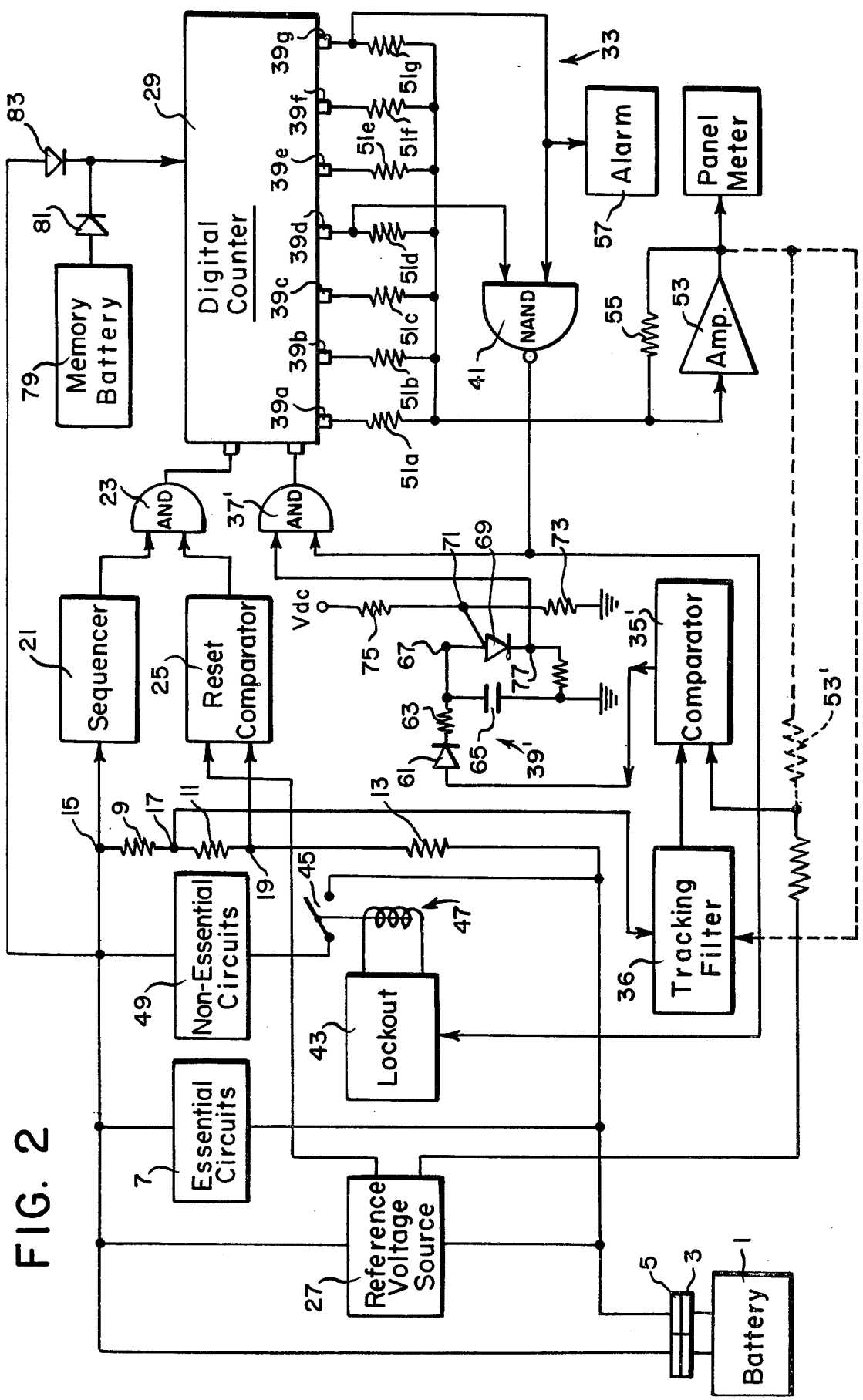
FIG. 2 is an alternative embodiment of a control system constructed in accordance with the present invention.

Referring to FIG. 2, an alternative embodiment of the apparatus of the present invention is illustrated. The operation of this system is largely identical to that of the system illustrated in FIG. 1. The primary difference is that oscillator 39, tracking comparator 35 and AND gate 37 have been replaced by tracking comparator 35', self-resetting integrator 39' and AND gate 37'. When a voltage below the threshold value is detected by comparator 35', it produces an output current which is fed via diode 61 and resistor 63 to capacitor 65. Capacitor 65 stores this current causing the voltage across the capacitor to rise. The voltage present across the capacitor is applied to terminal 67 of a unijunction transistor 69. Terminal 71 of the unijunction transistor is provided with a bias voltage by a voltage divider comprising resistors 73 and 75 which are connected to a source of DC power. Whenever the output of tracking comparator 35' becomes active, it sends current into capacitor 65, thereby raising the voltage at terminal 67. Even after the tracking comparator returns to its unactivated state, the voltage across and charge stored in capacitor 65 remains, and resumes increasing as soon as tracking comparator 35' is again actuated. When the voltage present at terminal 67 reaches a value sufficiently high, unijunction transistor 69 will be driven into conduction, thereby producing an output at its terminal 77. This signal is coupled to AND gate 37' and, when NAND gate 41 is active, will result in the passing of a pulse to counter 29 and advancement of the counter. During the course of completely discharging a battery, capacitor 65 is charged and discharged a great number of times with the resultant application of a pulse from terminal 77 and AND gate 37' every time the capacitor is discharged. It is thus seen that self-resetting integrator 39' produces a train of pulses in response to tracking comparator 35' and thus functions in the place of an oscillator.

Figure 3:
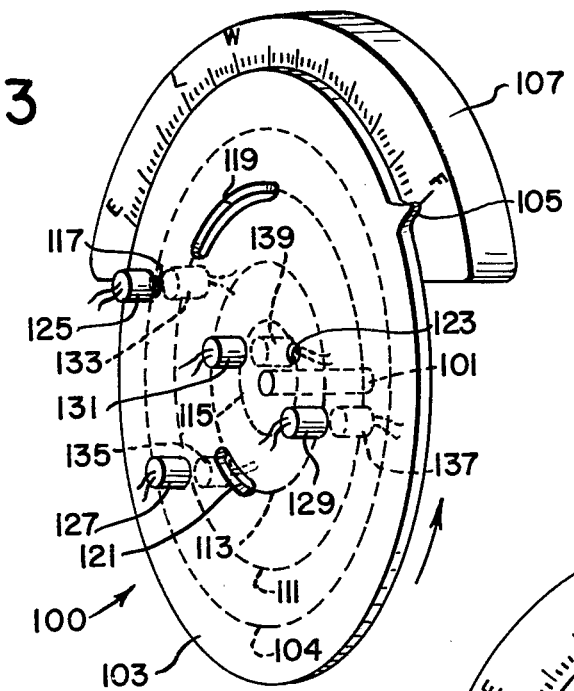
FIG. 3 is a perspective view of an indicator for use in conjunction with still another embodiment of the invention.

An alternative embodiment of the present invention is illustrated in FIGS. 3–7. Referring to FIG. 3, an indicator 100 comprises a shaft 101 driven by a stepping motor (not shown in this figure) driving a disk 103 serves in place of the counter, memory battery and display unit in other embodiments. The stepping motor is advanced an increment every time it receives an electrical pulse. This advances disk 103 which includes an indicator tab 105 indicating the state of charge of the battery on a calibrated scale 107. The angular position of the disk 103 serves as an indication of the state of charge of the battery. Disk 103 includes four tracks 104, 111, 113 and 115 which contain information cutouts 117, 119, 121 and 123, respectively. Cutout 117 serves to indicate when the indicator is in the full position. Cutout 119 serves as a warning slot indicating that the battery has been seriously discharged and that lift lockout will soon occur. Cutout 121 provides a control signal for the lift lockout and finally, cutout 123 provides control information for preventing further advancement of the disk when discharge is complete. This particular information is especially important if the indicator is so constructed that the scale takes up a major portion of the angle through which the disk moves and further advancement of the disk is likely to advance the tab 105 to the full position though the battery is depleted. It is also noted that, if desired, some economy may be obtained by using cutout 121 to perform the function of hole 123, thus eliminating the need for one of the tracks with its associated circuitry. In this case, cutout 121 would be reduced to a small hole.

Figure 4:
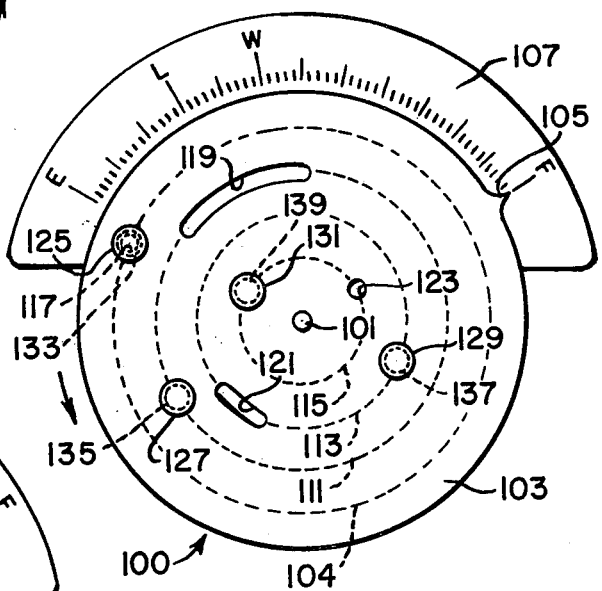
FIGS. 4–6 are plan views of the indicator illustrated in FIG. 3 in various positions corresponding to different levels of charge.
Figure 5:
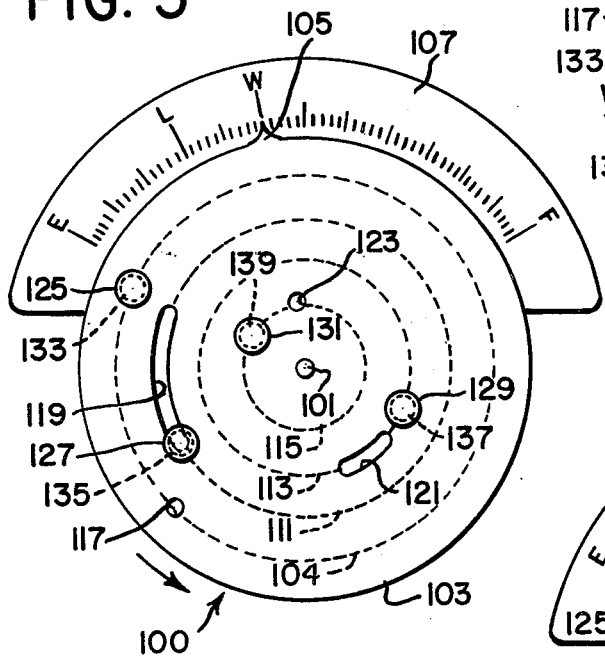
Figure 6:
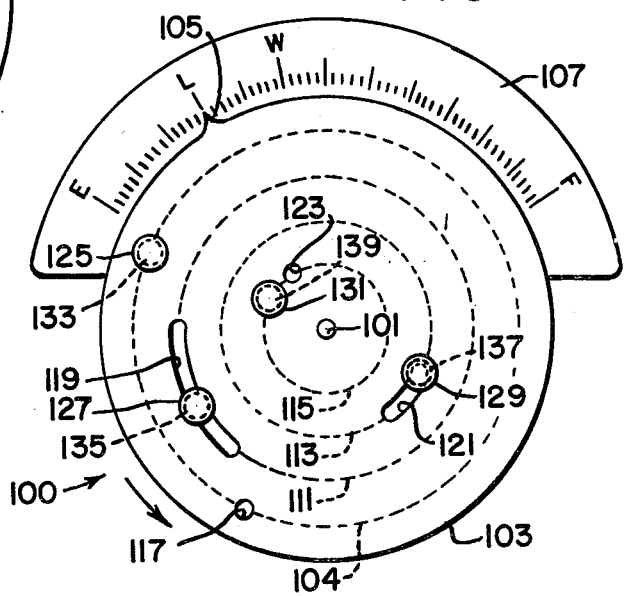

The information contained in the cutouts is read by four light emitting diodes 125, 127, 129 and 131 and corresponding photocells 133, 135, 137 and 139. Initially, the disk is in the full position where light is allowed to pass only from light emitter 125 to its associated photocell 133 and no light is allowed to pass from light emitters 127–131 to their associated photocells 135–139, respectively, as illustrated in FIGS. 3–4. As the battery is depleted and the disk advances in response thereto, the light from diode 127 begins to pass through cutout 119 onto photocell 135, activating appropriate warning circuitry and indicating that lift lockout will soon follow. This condition is illustrated in FIG. 5. The disk next passes to the position shown in FIG. 6, where light also begins to pass from light emitting diode 129 to photocell 137. This causes the actuation of the lift lockout circuitry. Finally, as the battery continues to be discharged and the disk continues to rotate, light from light emitting diode 131 begins to pass through cutout 123 and impinge upon photocell 139. This prohibits further rotation of disk 103 and thus prevents it from continuing to rotate until it again reaches the full position.

Figure 7:
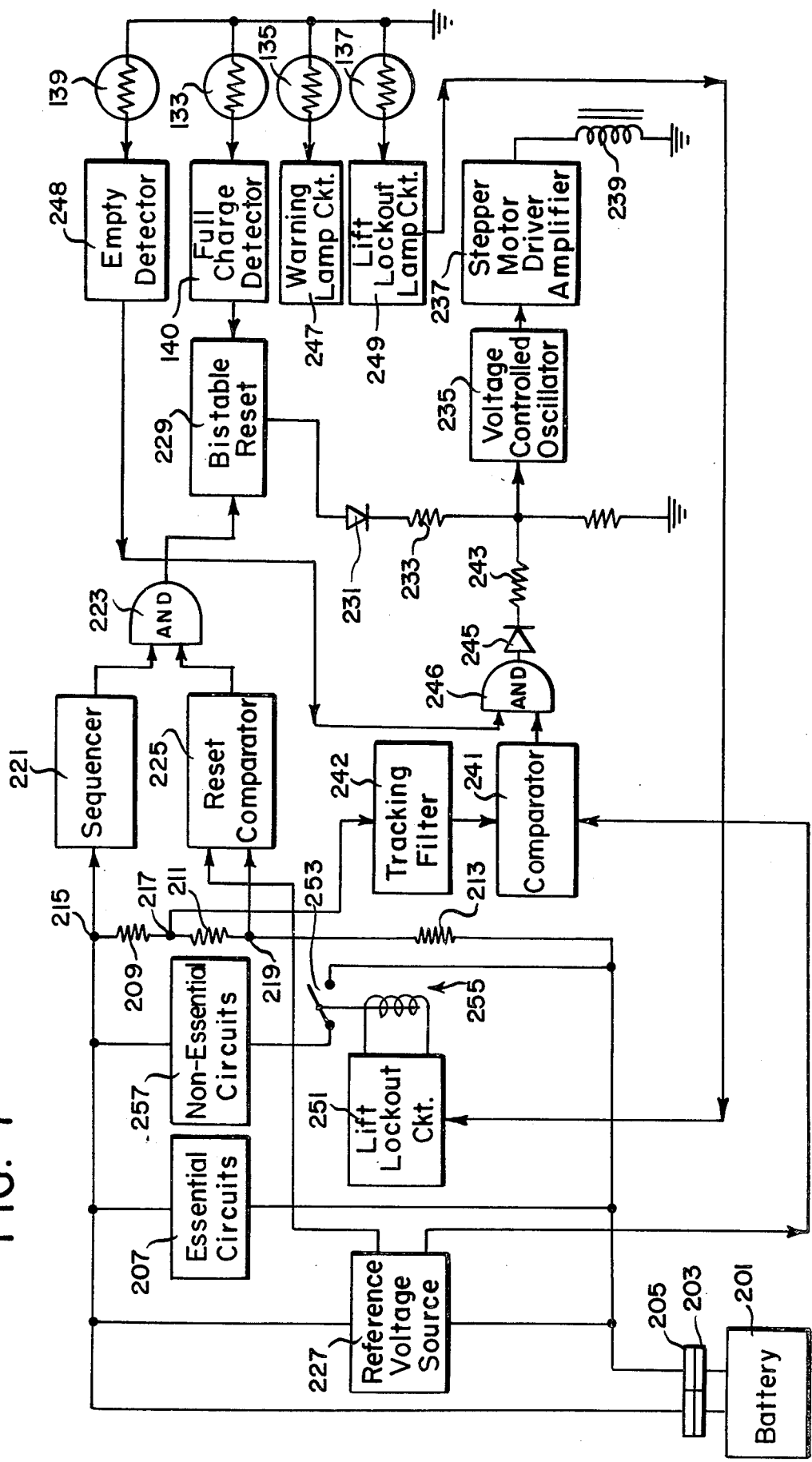
FIG. 7 is a schematic diagram of a battery state of charge monitoring system incorporating the indicator illustrated in FIGS. 3–6.

A typical control circuit for use with indicator 100 is shown in FIG. 7. Power to the system is supplied by a battery 201. Battery 201 is coupled to the system via mating connectors 203 and 205. Connection of the battery to the system via connectors 203 and 205 results in coupling power to essential circuits 207. These circuits include all the systems in the vehicle which one does not wish to disable in response to the indication of a depleted state of charge in the battery. Connection of the battery to the system also results in application of a voltage to resistors 209, 211 and 213, thereby causing voltages to appear at points 215, 217 and 219 in the electrical circuit. The magnitudes of these voltages are functions of the magnitude of the voltage present at the output terminals of battery 201.

Connection of battery 201 to the system thus results in the application of voltage from point 215 to a sequencer 221. This causes the sequencer to produce a logical 0 output which is coupled to an AND gate 223 which is thus disabled and produces a logical 0 output. AND gate 223 is disabled in order to cause it to be unresponsive to any transients which may pass through the system during connection of the battery via connectors 203 and 205. After a fixed period of time which may typically be in the order of one second, or as long as is necessary for all transients to subside, the output of the sequencer becomes logical "1".

As also discussed above, connection of the battery to the system also results in the presence at point 219 of a voltage whose magnitude is proportional to the voltage present at the output terminals of battery 201. This voltage is coupled to a reset comparator 225 which compares it with a reference voltage supplied by a reference voltage source 227 which is powered by battery 201. If comparator 225 detects that the voltage present at the output terminals of battery 201 is above a threshold which may typically be in the order of 10 percent higher than the nominal terminal voltage of the battery for batteries of the lead-acid variety, comparator 225 will produce a logical 1 output. This output, together with the logical 1 output of the sequencer, will actuate AND gate 223 causing a logical 1 pulse to appear at its output.

The logical 1 pulse is then coupled to a bistable reset circuit 229, thereby setting the circuit and coupling a relatively large signal via diode 231 and resistor 233 to a voltage controlled oscillator 235. This voltage controlled oscillator has a characteristic that when no signal is coupled to it, it produces an extremely low frequency oscillation having a frequency essentially equal to zero. When a relatively small signal is coupled to it, it has a relatively low frequency signal at its output. When a relatively large signal is coupled to it, it has a relatively high frequency signal at its output. Thus, the relatively large signal coupled to oscillator 235 results in its producing a relatively high frequency signal which is coupled to stepping motor driving amplifier 237. This amplifier drives the coil 239 of the stepping motor that drives disk 103 relatively quickly until pointing tab 105 reaches the position indicative of full charge. This condition is detected by photocell 133 due to the fact that light from light emitting diode 125 falls upon it in this position through cutout 117. This condition is sensed by full charge sensing circuit 140 which resets the output of bistable flip-flop 229, thus removing voltage from voltage controlled oscillator 235.

The terminal voltage is monitored by a comparator 241 which compares the voltage present at point 217 to a voltage which is a function of one of the outputs of reference voltage 227. The voltage present at point 217 is coupled by filter 242 whose function is identical to filter 36 in FIGS. 1 and 2. The output of comparator 241 is coupled to voltage controlled oscillator 235 via resistor 243, diode 245 and AND gate 246. In the full position, no light impinges upon photocell 139. A detector 248 produces a logical 1 in response to this condition. Thus, after the indicator 100 has been set to a full indication, the detection of a drop in voltage below a predetermined threshold results in the application of a logical 1 input to diode 245, thus resulting in the application of the output of gate 246, which is of a relatively low voltage, to voltage controlled oscillator 235. This in turn causes oscillator 235 to produce a relatively low frequency and thus advance the stepping motor at a relatively low rate in response to the reduction of the battery's terminal voltage below the threshold value. It is thus seen that the display on indicator 100 is advanced relatively quickly during reset and relatively slowly during operation.

As the stepping motor is advanced, light from light emitter 127 is caused to impinge upon photocell 135 through cut-out slot 119. Actuation of photocell 135 results in the detection of this condition by warning lamp circuit 247 which in turn illuminates a warning lamp advising the operator that lift lockout is about to occur.

Further advancement of the motor results in further rotation of disk 103, causing cutout slot 121 to align with light emitting diode 129 and photocell 137, thus actuating photocell 137 and coupling a signal to lift lockout circuit 249 which in turn actuates a lift lockout lamp to advise the operator of the fact that lift has been locked out. Lockout of the lift is accomplished by coupling a signal from photocell 137 to lift lockout circuit 251 to actuate the lockout circuit, thereby opening the contacts 253 of a relay 255 and disconnecting power from nonessential electrical circuits 257. It is noted that relay 255 may be replaced by any well known equivalent such as an SCR or triac.

Still further rotation of disk 103 results in aligning cutout 123 with light emitting diode 131 and photocell 139. This results in a logical 0 at the output of detector 248. This logical 0 disables further advancement of indicator 100.

While several illustrative embodiments of the invention have been illustrated, it is, of course, understood that various modifications may be made, especially in accordance with the teachings of the above-referenced U.S. application Ser. No. 538,463. For example, a plurality of threshold detectors, each of said detectors having a different threshold value and being responsive to said terminal voltage to produce an output signal when the terminal voltage drops below its respective threshold value, may be used for sensing reductions in terminal voltage. Thus, a desired threshold detection response may be synthesized through the selection of various thresholds and various electrical outputs for each of the plurality of threshold detectors. Further variation may be had by varying the frequency at the pulses produced and the reference or threshold value in response to the output of the integrator whether it be a digital counter or stepping motor. In the case of the stepping motor, additional led-photocell combinations can provide any desired integral related feedback. Such modifications are within the scope of the invention as limited and defined only by the appended claims.

What is claimed is:

1. Apparatus for monitoring the condition of a battery comprising:
   means for monitoring the output terminal voltage of the battery and producing an output signal when the magnitude of the terminal voltage is less than a threshold value;
   a stepping motor for integrating said output signal; and
   indicator means driven by said stepping motor for indicating the integral stored in said stepping motor.

2. The apparatus of claim 1, wherein said output signal is at least a single pulse for each reduction in voltage below a threshold value.

3. The apparatus of claim 1, wherein said output signal is a series of pulses, the number of pulses being proportional to at least the time that said terminal voltage is below said threshold value.

4. The apparatus of claim 1, wherein said indicator means is a rotating disk with at least one track thereon, points of the track corresponding to various integrals stored in the stepping motor, each said track having at least one hole corresponding to an integral or a range of integrals and at least one photocell disposed on one side of each track and a corresponding light source disposed on the other side of each track, whereby each said light source produces a control signal by actuating the photocell on the opposite side of the track when the angular position of the disk is such as to dispose a hole between said photocell and said light source.

5. The apparatus of claim 4, wherein one control signal is used to activate an alarm when the integral stored in the stepping motor reaches a first level.

6. The apparatus of claim 4, wherein said disk has at least two tracks thereon.

7. The apparatus of claim 6, wherein one control signal is used to activate an alarm when the integral stored in the stepping motor reaches a first level and a second control signal is used to disconnect the battery from at least a portion of its load when the integral stored in the stepping motor reaches a second and higher level.

8. The apparatus of claim 4, wherein said indicator means further comprises means for displaying the angular position of the disk to an observer.

9. The apparatus of claim 4, wherein said indicator means further comprises a pointer mounted on the disk for rotation therewith and a stationery scale, said pointer and scale cooperating to provide a read out of the integral stored in said stepping motor.

* * * * *